United States Patent
Koller et al.

(10) Patent No.: US 10,460,972 B2
(45) Date of Patent: Oct. 29, 2019

(54) METHOD OF DETACHING SEMICONDUCTOR MATERIAL FROM A CARRIER AND DEVICE FOR PERFORMING THE METHOD

(71) Applicant: Infineon Technologies AG, Neubiberg (DE)

(72) Inventors: Adolf Koller, Regensburg (DE); Florian Sedlmeier, Teugn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/137,022

(22) Filed: Apr. 25, 2016

(65) Prior Publication Data

US 2016/0315012 A1   Oct. 27, 2016

(30) Foreign Application Priority Data

Apr. 27, 2015   (DE) .......................... 10 2015 106 448

(51) Int. Cl.
*H01L 21/683* (2006.01)
*H01L 21/67* (2006.01)
*H01L 21/78* (2006.01)

(52) U.S. Cl.
CPC .... *H01L 21/6836* (2013.01); *H01L 21/67092* (2013.01); *H01L 21/67132* (2013.01); *H01L 21/78* (2013.01); *H01L 2221/68327* (2013.01); *H01L 2221/68336* (2013.01); *H01L 2221/68381* (2013.01)

(58) Field of Classification Search
None
See application file for complete search history.

(56) References Cited

U.S. PATENT DOCUMENTS

| | | | |
|---|---|---|---|
| 2002/0019074 A1 | 2/2002 | Nakazawa et al. | |
| 2006/0177777 A1* | 8/2006 | Kawamura | G03F 7/11 430/322 |
| 2007/0261783 A1* | 11/2007 | Larson | B29C 63/0013 156/247 |
| 2008/0070378 A1* | 3/2008 | Yeo | B23K 26/0604 438/460 |
| 2008/0180628 A1* | 7/2008 | Tasaka | G02F 1/133351 349/187 |
| 2008/0280421 A1* | 11/2008 | Nakamura | B23K 26/0057 438/462 |
| 2015/0348821 A1* | 12/2015 | Iwanaga | H01L 21/78 257/798 |

FOREIGN PATENT DOCUMENTS

JP    2006319150 A    11/2006

* cited by examiner

*Primary Examiner* — Charles D Garber
*Assistant Examiner* — Xiaoming Liu

(57) ABSTRACT

Various embodiments provide a method of detaching semiconductor material from a carrier, wherein the method comprises providing a carrier having attached thereto a layer of semiconductor material, wherein the layer comprises an edge portion; and guiding an air stream onto the edge portion of the layer of semiconductor material.

13 Claims, 3 Drawing Sheets

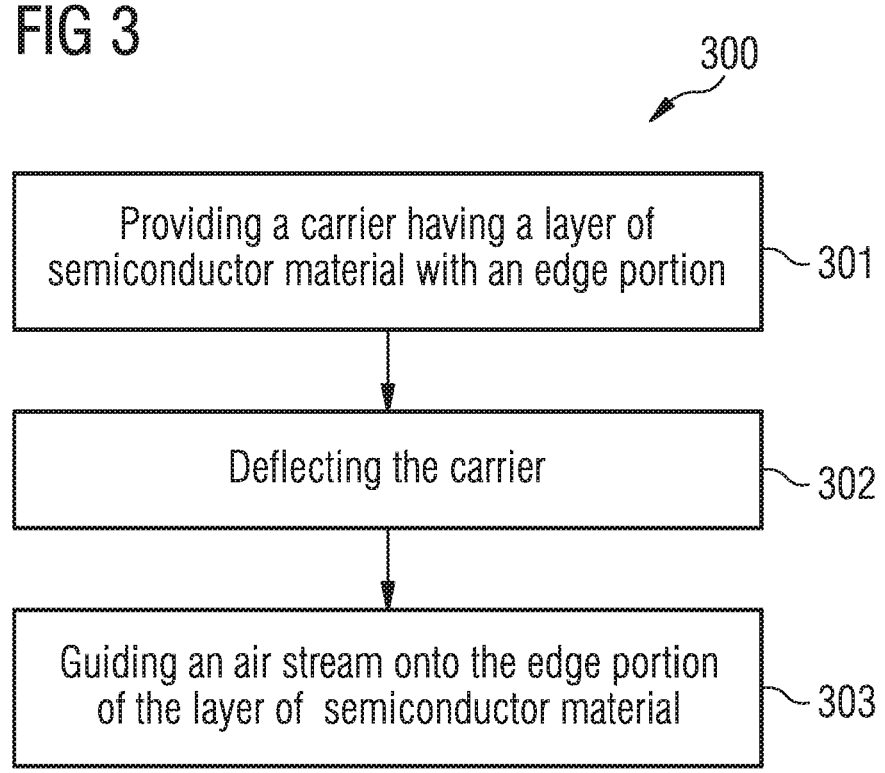

METHOD OF DETACHING SEMICONDUCTOR MATERIAL FROM A CARRIER AND DEVICE FOR PERFORMING THE METHOD

TECHNICAL FIELD

Various embodiments relate to a method of detaching semiconductor material, in particular a semiconductor ring, from a carrier, in particular a dicing tape, and a device for performing the method.

BACKGROUND

In the field of manufacturing processes of semiconductor elements so called transfer or dicing tapes or carriers are used to which a thin wafer is attached or and/or on which it processed. For removing the processed semiconductor chips or dices from the carrier the wafer is cut or the chips are singularized and subsequently detached from the carrier. Due to technology limitations often an edge portion of the wafer or semiconductor layer is not processed and cut but forms a continuous or nearly continuous ring which as well has to be detached from the carrier to easily remove the dices.

For easing the detaching often an elastic carrier, e.g. a saw foil, is used which is mounted in a frame (structure) and expanded before the semiconductor chips or dies are detached from the carrier.

SUMMARY

Various embodiments provide a method of detaching semiconductor material from a carrier, wherein the method comprises providing a carrier having attached thereto a layer of semiconductor material, wherein the layer comprises an edge portion; and guiding an air stream onto the edge portion of the layer of semiconductor material.

Furthermore, various embodiments provide a device for detaching a semiconductor layer from a carrier, wherein the device comprises a frame configured to mount a carrier; and an air stream unit configured to guide an air stream on edge portions of the mounted elastic carrier.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIG. 3 illustrate a flowchart of a method of detaching a semiconductor layer from an elastic carrier according to an exemplary embodiment.

DETAILED DESCRIPTION

Figure 1:
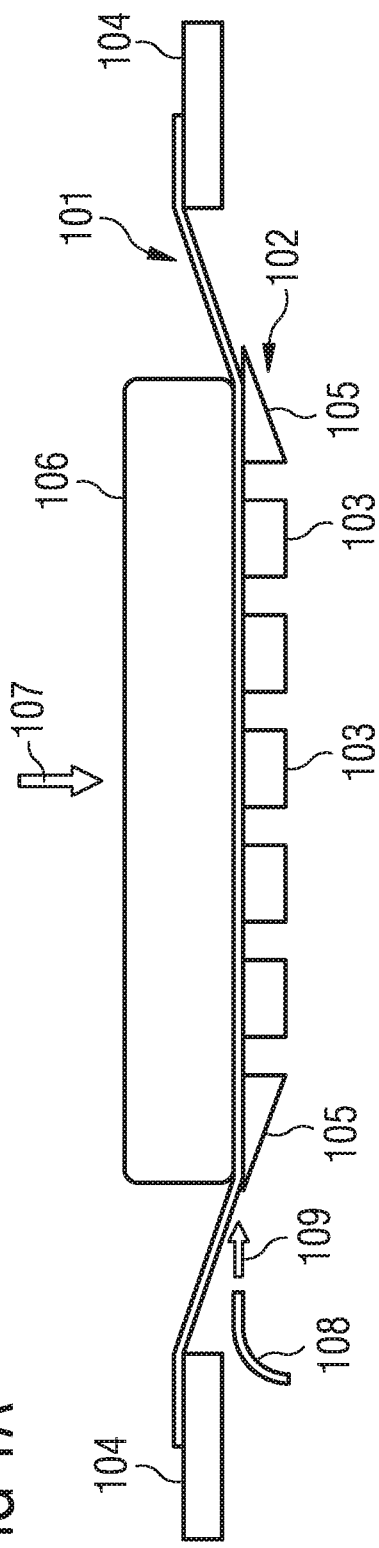
FIGS. 1A and 1B schematically shows a cross sectional view of an elastic carrier having attached thereto a semiconductor wafer and illustrating a detaching step according to an exemplary embodiment.

In the following further exemplary embodiments of a method of detaching semiconductor material from a carrier and a corresponding device are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a method of detaching portions of a semiconductor layer from a carrier like a dicing tape, wherein a stream of (pressurized) air is guided onto edge portions of an semiconductor layer.

In particular, the semiconductor material may be a semiconductor wafer, like a silicon wafer, or a portion thereof, e.g. an outer ring or edge portion. According to some exemplary embodiments an optional deflection of the (elastic) carrier may be performed in the or close to the edge portion of the layer of semiconductor material, preferably in the portion or area of the (elastic) carrier on which the edge portion of the semiconductor layer is attached to. For example, the (elastic) carrier may be a saw foil or tape. In particular, the edge portion of the semiconductor layer may form a ring portion encircling or forming the outer edge or rim of the semiconductor layer. It should be mentioned that the carrier does not have to be an elastic carrier. However, an optional deflection of an elastic carrier may ease the detaching.

For example, the edge portion may be the portion of the semiconductor layer which is not cut or sawn into separated portions or elements. A width of the edge portion (which may be detached according to exemplary embodiments) may be in the range of 1 millimeter to 5 millimeter, in particular, in the range of 2.5 millimeter to 3 millimeter.

In particular, the air stream may be formed by pressurized air. For example, the pressurized air may be guided onto the edge portions in a direction parallel or at least substantially parallel to the carrier, in particular, to a main surface of a plane or foil like (elastic) carrier. It should be noted that a strength (e.g. volume and/or speed, and/or pressure) of the air stream may be adjusted or set differently at different portions of the semiconductor layer. For example, at edge portions attached more securely or persistent (and/or at a wider area) to the carrier the strength of the air stream may be increased, while at loser portions the strength may be decreased. However, it should be noted that also an optional additional mechanical lift off function may be foreseen so that the air stream only eases the mechanical lift off action.

By providing a (pressurized) air stream onto the edge portions of the semiconductor layer it may be possible to ease or facilitate a detaching or even cause a (at least partial) detaching of the edge portions of the semiconductor layer (e.g. a wafer). In particular, the method may be beneficial in cases where an uncut or unseparated edge portion may remain after a process separating portions of the semiconductor layer (e.g. dices in the case of a wafer) from each other.

However it should be noted that the method may be beneficial for not only detaching edge portions of a wafer from an (elastic or flexible) carrier but for detaching any relatively thin semiconductor layers from a carrier. In this context, relatively thin may be in the range of 500 micrometer and 25 micrometer, in particular, between 400 micrometer and 40 micrometer, e.g. in a range about 330 micrometer and 50 micrometer.

In the following exemplary embodiments of the method of detaching semiconductor material are described. However, the features and elements described with respect to these embodiments can be combined with exemplary embodiments of the device for detaching a semiconductor layer.

According to an exemplary embodiment of the method the carrier is mounted in a ring frame. For example, the ring frame may be a frame adapted or configured for 8 inch or 12 inch wafers.

According to an exemplary embodiment of the method the layer of semiconductor material is separated in a plurality of semiconductor portions.

In particular, each of the semiconductor portions may correspond to one dice of a semiconductor wafer, which are already separated from each other. However, the plurality of semiconductor portions or dices may still be attached to the (elastic) carrier.

According to an exemplary embodiment the method further comprises performing a separating step to form the separated semiconductor portions.

In particular, the separating step may comprise applying a plasma to the layer of semiconductor material. For example, the plasma may be used to etch or cut the semiconductor layer (e.g. a wafer) into separated portions (corresponding to dices for example). In particular, the separating may be performed before detaching the semiconductor material from the carrier. It should be noted that while the method according to an exemplary embodiment may be in particular suitable for detaching a continuous edge ring (i.e. unseparated) of a semiconductor layer from a carrier as it is formed or generated via a plasma etching or sawing process, the method may be combined in principle with any separating, cutting or sawing process.

According to an exemplary embodiment of the method the air stream impacts on the edge portion of the semiconductor layer on a point rotating around an axis.

In particular, the axis may be perpendicular or substantially perpendicular to a main surface of the semiconductor layer and/or (elastic) carrier. It should be noted that the rotation of the impact point or impinging point may rotate due to a rotation of the (elastic) carrier and/or a point where the air stream is generated or guided onto the edge portion of the semiconductor layer.

According to an exemplary embodiment of the method the rotating of the point is caused by at least one of the group consisting of: rotating the carrier; and rotating a source of the air stream.

In particular, the source of the (pressurized) air stream may be a nozzle, tip, tube, pipe or injector connected to an air pump or a reservoir containing pressurized air.

According to an exemplary embodiment the method further comprises deflecting the carrier in a direction having an angle greater than zero with respect to a surface of the layer of semiconductor material.

It should be noted that the carrier is preferably an (at least slightly) elastic carrier. Such a deflection may ease the detaching or lift-off of the edge portion of the layer of semiconductor material. For example, the direction may be (substantially) perpendicular to the surface of the layer of semiconductor material. In particular, the angle may be in the range of 45° to 135°, preferably between 75° and 105°, e.g. between 85° and 95°.

According to an exemplary embodiment of the method the deflecting of the carrier is performed by pressing a chuck onto the carrier.

In particular, the chuck may be pressed on the (elastic) carrier at least at portions which correspond to the edge portions of the semiconductor layer (but on the backside of the carrier). Thus, the chuck may have an annular form or shape for example corresponding to an edge portion of a typical semiconductor wafer. Alternatively, the chuck may be a solid or plain cylinder.

According to an exemplary embodiment of the method the deflecting of the carrier is performed by pressing a roller onto the carrier.

In particular, the roller may be moved or rolled along the edge portion of the semiconductor layer (however on the opposite side of the carrier as the semiconductor layer of course). Alternatively or additionally the semiconductor layer may be moved below the roller pressing on the semiconductor layer. That is, a relative movement of the roller or barrel may be provided by moving the roller and/or the semiconductor layer. In particular, this relative movement may be synchronized with a point at which the air stream is guided onto the (elastic) carrier. For example, the roller or barrel and a nozzle providing the air stream may be a combined unit or element. Thus, it may be possible that exactly the deflected or expanded portion of the (elastic) carrier is impinged or struck by the air stream.

According to an exemplary embodiment of the method the air stream impacts on a deflected portion of the carrier.

In particular, the air stream may only or substantially only impacts or strike portions of the (elastic) carrier which are deflected or expanded. For example, only portions of the (elastic) carrier may be deflected and only (or at least substantially only) on these deflected portions the air stream is directed or guided. Therefore, undeflected portions of the (elastic) carrier may (substantially) not be impinged, impacted or struck by the air stream. Of course some (undesired) remnants or traces of the air stream may still impact on undeflected portions of the (elastic) carrier.

According to an exemplary embodiment the method further comprises irradiating portions of the carrier corresponding to the edge portion of the semiconductor layer by light.

In particular, the light may be UV-light, i.e. light having a wavelength less than visible light. For example, a LED or laser diode may be used as a light source. By irradiating the portions of the carrier corresponding to the edge portions of the semiconductor layer (i.e. the portions onto which the edge portions are attached to) it may be possible to ease the detaching of the semiconductor layer, e.g. when an adhesive or a carrier is used which becomes brittle or loses its adhesive properties under (UV) irradiation.

In the following exemplary embodiments of the device for detaching a semiconductor layer are described. However, the features and elements described with respect to these embodiments can be combined with exemplary embodiments of the method of detaching semiconductor material.

According to an exemplary embodiment of the device the air stream unit comprises at least one element out of the group consisting of: a nozzle, an air tube; an air pump; a pressurized air reservoir; a moving unit; and a deflection unit.

In particular, a nozzle or (jet) injector may be used to provide a focused air stream so that a selective air stream may be providable. For example, the air stream may be directed or focused on deflected portions of the carrier mounted in the frame. An air tube may be used to guide air form an air pump or a pressurized air reservoir to a nozzle or even to provide directly the air of the air pump to the (elastic) carrier. A moving unit may be configured to move the air stream unit along a suitable path, e.g. around the edge portion of the semiconductor layer or the (elastic) carrier to which the semiconductor layer is attached to. A deflection unit may be configured to deflect the (elastic) carrier in a direction having an angle greater than zero with respect to a surface of the layer of semiconductor material.

According to an exemplary embodiment of the device the deflection unit is selected out of the group consisting of: a roller; a chuck; a wheel; solid cylinder; and hollow cylinder.

In addition the deflection unit may as well comprise an actuator and/or a moving unit configured to move the deflection unit, e.g. around the edge portion of the semiconductor layer or the (elastic) carrier to which the semiconductor layer is attached to, and/or to press the deflection unit onto the (elastic) carrier.

According to an exemplary embodiment the device further comprises an irradiation unit configured to irradiate a carrier when mounted to the frame.

The use of an irradiation unit for emitting light, e.g. UV-light, may be a suitable provision in case an adhesive used to attach the semiconductor layer to the (elastic) carrier or the (elastic) carrier itself is sensitive to the respective wavelength so that the detaching of the semiconductor layer may be eased or facilitated.

In the following specific embodiments of the method of detaching semiconductor material and the device for detaching a semiconductor layer will be described in more detail with respect to the figures.

FIGS. 1A and 1B schematically shows a cross sectional view of an elastic carrier having attached thereto a semiconductor wafer and illustrating a detaching step according to an exemplary embodiment. In particular, FIG. 1A shows an elastic carrier 101, like a dicing tape, having attached thereto a semiconductor layer 102, e.g. a semiconductor wafer, forming a plurality of dices 103 which are separated using a suitable singularizing process, like plasma etching or cutting for example. The elastic carrier 101 is mounted in a frame 104. It should be noted that the semiconductor layer may have a thickness below 400 micrometer, e.g. in the range between 25 micrometer and 400 micrometer.

For easing or facilitating a detaching of the semiconductor layer at an edge portion 105 (forming a ring) a chuck 106 (having the form of a solid cylinder) is pressed onto the elastic carrier 101 indicated by arrow 107. The pressure of the chuck leads to a deflection of the elastic carrier. It should be noted that the transition portion between the portions which are mounted to the frame and the portions on which the semiconductor layer (wafer) is attached to (or the chuck is pressing onto) may form deflected portions of the elastic carrier. That is, portions of the carrier which are not horizontally in FIG. 1A may form deflected portions.

It should be noted that while the edge portion of the semiconductor layer 102 is shown to already be lifted off the elastic carrier 101 this is not necessarily the case in case of a thin semiconductor layer. Depending on the processing techniques a width of the edge portion may be in the range between 1 millimeter and 5 millimeter, e.g. 2.5 to 3.0 millimeter.

In addition FIG. 1A shows a tube or pipe 108 for applying an air stream onto the edge portion of the semiconductor layer 102, wherein the air stream is indicated by arrow 109. For facilitating a focused air stream the tube 108 may end in a nozzle. It should be noted that, while the end of the tube or pipe 108 is shown to be substantially parallel to the elastic carrier 101, the tube may be arranged in any desired angle. In particular, it should be noted that depending on the chosen angle the detaching may be eased to a different extend.

FIG. 1B shows the cross sectional view of FIG. 1A at a slightly later point in time at which the edge portion of the semiconductor layer or wafer ring is already detached totally from the elastic carrier 101. Depending on the dimensions of the ring, the strength of the air stream etc., the detaching may be achievable purely by the air stream or may be supported by a mechanical lift off. In general the air stream will not be enough to lift off the semiconductor layer alone but eases the lift off substantially.

Figure 2:
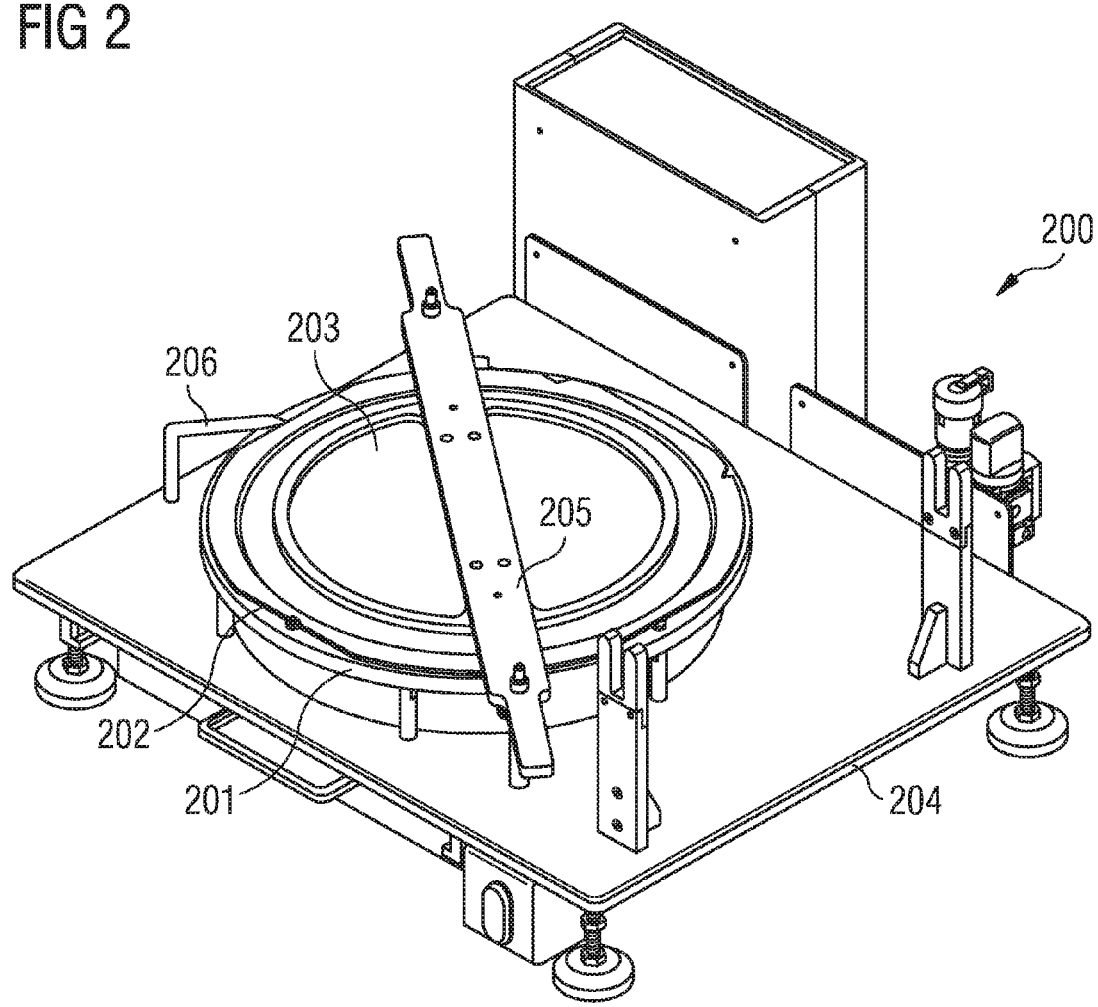
FIG. 2 schematically shows a perspective view of a device for detaching a semiconductor layer from an elastic carrier according to an exemplary embodiment.

FIG. 2 schematically shows a perspective view of a device 200 for detaching a semiconductor layer from an elastic carrier according to an exemplary embodiment. In particular, the device 200 (which may be a fully automatic machine or a semi-automatic machine) comprises a frame 201 in which an elastic carrier 202 is mounted according to FIG. 2. In addition the device comprises a chuck 203 which can be used to apply a pressure force to the elastic carrier and thus deflect the same. The frame 201 or frame structure may be mounted on a platform 204. Furthermore, the device 200 comprises an actuator 205 for applying a force to the chuck 203 and thus to the elastic carrier 202.

In addition the device comprises an air stream unit 206 (only schematically indicated in FIG. 2) like a nozzle connected via a tube or pipe to a pump or to a container comprising pressurized air. Preferably, the air stream unit is movable with respect to the elastic carrier or the frame structure, e.g. via moving the air stream unit itself and/or by moving the elastic carrier, e.g. by moving or rotating the frame. Thus, it may be possible to guide the air stream to any desired portion or part of the edge portion of the semiconductor layer, so that a detaching may be eased along the complete edge portion.

An optional irradiation unit is not shown in FIG. 2 but may be foreseen and may be connected to the air stream unit so that the irradiation unit may as well be moveable in case the air stream unit is moveable or rotatable with respect to the elastic carrier. Such an irradiation unit may be particularly useful in case the attachment of the semiconductor to the elastic carrier can be brittled or weakened by light. In particular, the irradiation unit may be moveable synchronously with the air stream unit so that always a portion of the carrier and/or the attached thereto semiconductor layer close to the point struck by the air stream is irradiated shortly before the air stream strikes the semiconductor layer. This may be ensured by (mechanically) coupling the air stream unit and the irradiation unit or by just moving both synchronously.

FIG. 3 illustrate a flowchart of a method 300 of detaching a semiconductor layer from a carrier according to an exemplary embodiment. In particular, the method 300 comprises providing a carrier having attached thereto a layer of semiconductor material, wherein the layer comprises an edge portion (step 301). In an optional step the semiconductor layer, e.g. a wafer, may be cut or separated into a plurality of portions or elements each forming a dice. For example, the separating may be performed by a process in which a continuous outer ring of the semiconductor layer may maintain, e.g. a separation process based on applying a plasma.

In a next optional step the carrier may be deflected in a direction having an angle greater than zero with respect to a surface of the layer of semiconductor material (step 302). In particular, the direction may be perpendicular or at least substantially perpendicular to a main surface of the carrier.

After the optional deflection step an air stream is guided onto the edge portion of the layer of semiconductor material (step 303). In particular, the air stream may be directed parallel or substantially parallel onto the elastic carrier while the strength of the air stream may be configured or set depending on the application, e.g. depending on the thickness of the semiconductor layer or the strength of the adhesion or the like. However, it should be noted that any relative angle between the elastic carrier and the air stream may be set depending on the circumstances.

For the detaching an additional mechanical force may be applied to the edge portion or ring of semiconductor material to actually detach the same, since in most cases it may not be suitable to detach the edge portion purely by the air stream.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of detaching semiconductor material from a carrier, the method comprising:
    providing a carrier having attached thereto a layer of semiconductor material, wherein the layer comprises an edge portion;
    deflecting the carrier in an area of the carrier, on which the edge portion of the layer of semiconductor material is attached, in a direction having an angle greater than zero with respect to a surface of the layer of semiconductor material; and
    guiding an air stream onto the edge portion of the layer of semiconductor material, wherein the air stream impacts on a deflected portion of the carrier, thereby removing only the edge portion of the semiconductor material from the carrier.

2. The method according to claim 1, wherein the carrier is mounted in a ring frame.

3. The method according to claim 1, wherein the layer of semiconductor material is separated in a plurality of semiconductor portions.

4. The method according to claim 3, further comprising performing a separating step to form the separated semiconductor portions.

5. The method according to claim 1, wherein the air stream impacts on the edge portion of the semiconductor layer on a point rotating around an axis.

6. The method according to claim 5, wherein the rotating of the point is caused by at least one of the group consisting of:
    rotating the carrier; and
    rotating a source of the air stream.

7. The method according to claim 1, wherein the deflecting of the carrier is performed by pressing a chuck onto the carrier.

8. The method according to claim 1, wherein the deflecting of the carrier is performed by pressing a roller onto the carrier.

9. The method according to claim 1, further comprising irradiating portions of the carrier corresponding to the edge portion of the semiconductor layer by light.

10. A device for detaching a semiconductor layer from a carrier, the device comprising:
    a frame configured to mount a carrier having attached thereto the layer of semiconductor material, wherein the layer comprises an edge portion;
    a deflection unit configured to deflect the carrier in an area of the carrier, on which the edge portion of the layer of semiconductor material is attached, in a direction having an angle greater than zero with respect to a surface of the layer of semiconductor material; and
    an air stream unit configured to guide an air stream on edge portions of the mounted elastic carrier, wherein the air stream impacts on a deflected portion of the carrier, thereby removing only the edge portion of the semiconductor material from the carrier.

11. The device according to claim 10, wherein the air stream unit comprises at least one element out of the group consisting of:
    a nozzle,
    an air tube;
    an air pump;
    a pressurized air reservoir;
    a moving unit; and
    the deflection unit.

12. The device according to claim 10, wherein the deflection unit is selected out of the group consisting of:
    a roller;
    a chuck;
    a wheel;
    a solid cylinder; and
    a hollow cylinder.

13. The device according to claim 10, further comprising:
    an irradiation unit configured to irradiate a carrier when mounted to the frame.

* * * * *